(12) United States Patent
Bal et al.

(10) Patent No.: US 8,878,710 B2
(45) Date of Patent: Nov. 4, 2014

(54) LOW LATENCY FILTER

(71) Applicant: STMicroelectronics International N.V., Amsterdam (NL)

(72) Inventors: Ankur Bal, Greater Noida (IN); Neha Bhargava, Greater Noida (IN); Anupam Jain, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 1 day.

(21) Appl. No.: 13/677,674

(22) Filed: Nov. 15, 2012

(65) Prior Publication Data

US 2014/0132434 A1      May 15, 2014

(51) Int. Cl.
*H03M 3/00*      (2006.01)
*H03M 1/12*      (2006.01)

(52) U.S. Cl.
CPC . *H03M 3/30* (2013.01); *H03M 1/12* (2013.01)

USPC .......................................... 341/143; 341/155

(58) Field of Classification Search
CPC .......... H03M 3/30; H03M 1/12; H04M 3/005
USPC .......................... 341/143, 155, 156, 120, 172
See application file for complete search history.

(56) References Cited

U.S. PATENT DOCUMENTS

| | | | | |
|---|---|---|---|---|
| 5,424,962 A | * | 6/1995 | Bouchez et al. | 702/181 |
| 6,693,984 B1 | * | 2/2004 | Andre | 375/350 |
| 7,456,620 B2 | * | 11/2008 | Maksimovic et al. | 323/283 |
| 2003/0198474 A1 | * | 10/2003 | Mooney et al. | 398/140 |
| 2009/0066549 A1 | * | 3/2009 | Thomsen et al. | 341/143 |

* cited by examiner

*Primary Examiner* — Joseph Lauture
(74) *Attorney, Agent, or Firm* — Graybeal Jackson LLP

(57) ABSTRACT

In an embodiment, a set of input samples are filtered to provide a set of filtered samples using an N-tap filter. A steady-state-response-output sample of the N-tap filter is determined from a N/2th sample of the set of filtered samples.

26 Claims, 5 Drawing Sheets

LOW LATENCY FILTER

TECHNICAL FIELD

An embodiment of the present application relates to filters. In particular, but not exclusively, an embodiment of the present application relates to filters in analog-to-digital converters.

BACKGROUND

Analog-to-Digital converters (ADCs) convert analog signals to digital signals by providing digital samples corresponding to the analog signal. Typically, the analog signal is sampled at the minimum sampling rate required by an application. However, sampling an analog signal at a much higher rate than the minimum required sampling rate, and then digitally filtering the resultant signal to limit signal bandwidth, may have some advantages in the resultant signal characteristics.

In some such oversampling ADCs, the analog signal may first be encoded using a modulation scheme, and then filtered by one or more digital filters in order to improve the resolution of the resulting signal. These digital filters, however, may incur a group delay and/or introduce a latency into the conversion of the analog signal. This conversion delay may be unsuitable for real-time applications that require little or no delay.

SUMMARY

According to a first embodiment, there is provided a method including: filtering a set of input samples to provide a set of filtered samples using an N-tap filter; and determining a steady-state-response output sample of the N-tap filter from a N/2th sample of the set of filtered samples.

The filter may be a linear finite-impulse-response (FIR) filter. Determining the steady-state-response output sample may include doubling a value of the N/2th filtered sample. The N/2 samples may be generated during a transient response of the N-tap filter. The determining may further include generating one or more steady-state-response output samples.

The N-tap filter may have an initial condition. The method may further include: resetting the N-tap filter in response to the N/2th filtered sample. The method may further include: filtering a further set of input samples to provide a set of further filtered samples by the N-tap filter; and determining a further steady-state-response output sample of the N-tap filter from a N/2th sample of the further set of filtered samples.

N may be an even number. The filter coefficients of the N-tap filter may be symmetrical. The steady-state-response output sample may be determined based on the symmetrical coefficients. The set of input samples may include N/2 samples. The set of filtered samples may include at least N/2 samples. The method may further include resetting a modulator.

The steady-state-response output sample and further steady-state-response output sample may form part of a pulse-code-modulated signal. The set of input samples may correspond to a pulse-density-modulated signal. The method may further include: modulating an analog signal to produce the set of input samples. The modulating may include pulse-density modulating. The modulating may include delta-sigma modulating.

According to an embodiment, there is provided an apparatus including: an N-tap filter configured to filter a set of input samples to provide a set of filtered samples; and a prediction unit configured to determine a steady-state-response output sample of the N-tap filter from a N/2th sample of the set of filtered samples.

The filter may be a linear finite-impulse-response (FIR) filter. The prediction unit may be configured to determine the steady-state-response output sample by doubling a value of the N/2th filtered sample. The N-tap filter may be configured to generate at least N/2 samples during a transient response of the N-tap filter. The prediction unit may be configured to generate one or more steady-state-response output samples.

The N-tap filter may have an initial condition. The N-tap filter may be further configured to be reset in response to the N/2th filtered sample. The N-tap filter may be further configured to filter a further set of input samples to provide a set of further filtered samples, and the prediction unit may be further configured to determine a further steady-state-response output sample of the N-tap filter from a N/2th sample of the further set of filtered samples.

N may be an even number. The filter coefficients of the N-tap filter may be symmetrical. The steady-state-response output sample may be determined based on the symmetrical coefficients. The set of input samples may include N/2 samples. The set of filtered samples may include at least N/2 samples.

The steady-state-response output sample and further steady-state-response output sample may form part of a pulse-code-modulated signal. The set of input samples may correspond to a pulse-density-modulated signal.

The apparatus may further be configured to modulate an analog signal to produce the set of input samples. In some embodiments, the apparatus may further include a modulator. The apparatus may be configured to carry out pulse-density modulating. The apparatus may be configured to carry out delta-sigma modulation.

According to an embodiment, there may be provided an analog-to-digital converter including: a modulator configured to configured to receive an analog signal and provide a set of input samples corresponding to the analog signal; an N-tap filter configured to filter the set of input samples to provide a set of filtered samples; and a prediction unit configured to determine a steady-state-response output sample of the N-tap filter from a N/2th sample of the set of filtered samples.

The modulator may be further configured to provide a further set of input samples each time the modulator receives a reset indication. The N-tap filter may be further configured to filter each set of further input samples to provide a respective further set of filtered samples. The prediction unit may be further configured to determine a respective further steady-state-response output sample of the N-tap filter from a N/2th sample of the respective further set of filtered samples.

The output samples and further output samples may form a pulse-code-modulated signal corresponding to the analog signal.

According to an embodiment, there may be provided an apparatus including at least one processor, and at least one memory including computer program code, the at least one memory and the computer program code configured to, with the at least one processor, cause the apparatus at least to perform: determining a steady-state-response output sample of an N-tap filter from a N/2 sample of a set of filtered samples wherein the filtered samples correspond to a set of input samples filtered by an N-tap filter.

DETAILED DESCRIPTION

Some embodiments may address the latency or group delay incurred by a digital filter. In some embodiments, the time taken for a filter to provide a steady-state-filter-response output sample is reduced without reducing the filter precision. In some embodiments, a sample corresponding to a transient-state response of a filter may be used to determine the steady-state-filter-response output of the filter. In some embodiments, the filter is used in an analog-to-digital converter.

Figure 1:
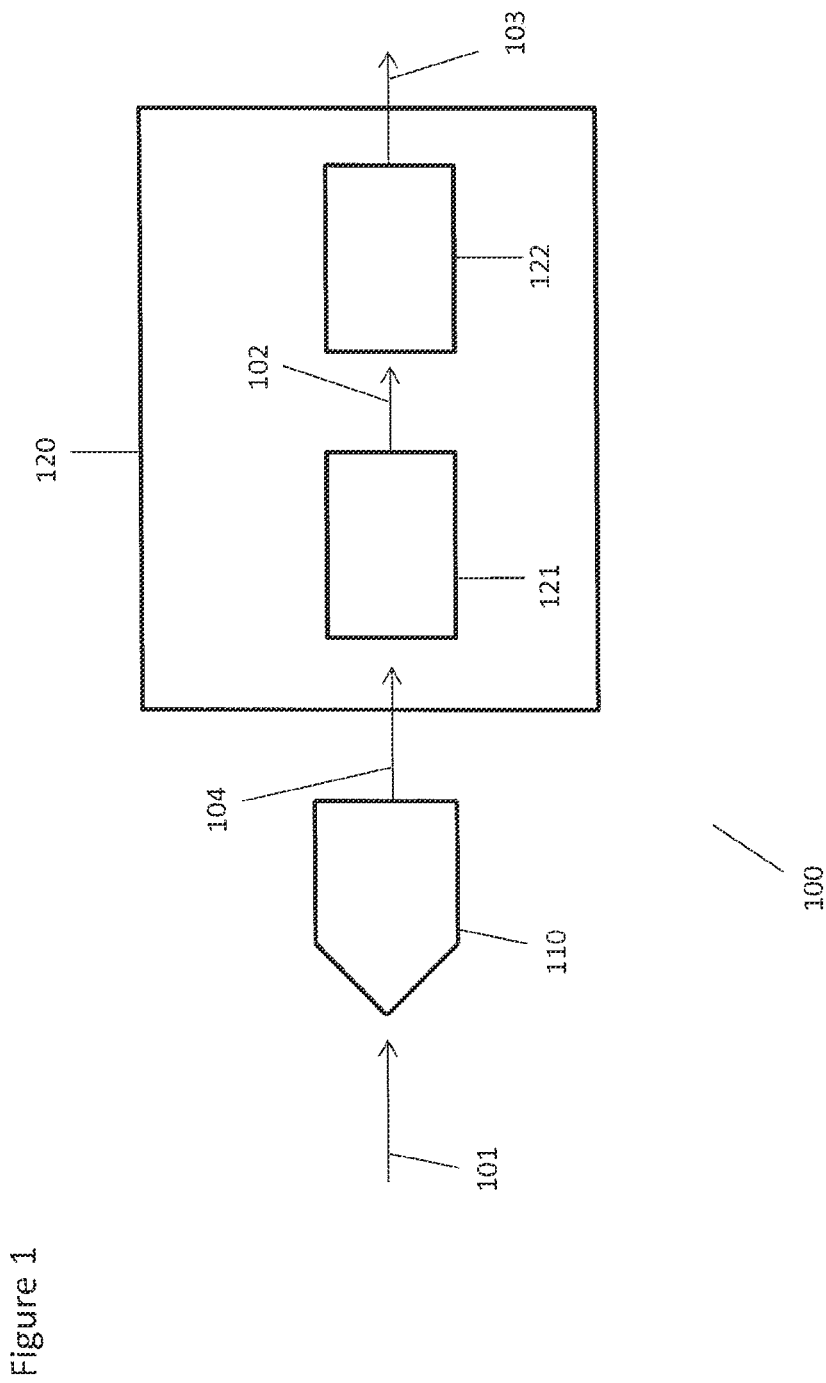
FIG. 1 is a diagram of an analog-to-digital converter.

FIG. 1 shows an example of an analog-to-digital converter (ADC) 100. The ADC 100 receives an analog input signal 101 and converts it to a digital output signal 103. The digital output signal 103 may include digital samples corresponding to the analog signal 101. The ADC 100 may include a modulator 110 for encoding the analog signal according to a modulation scheme, and a filter block 120 for reducing noise of the encoded signal and converting a sample rate to a specific data rate. In some embodiments, the filter block may include a digital low-pass filter 121 and a downsampler 122.

The modulator 110 may provide a signal 104 to the low-pass filter 121, which, in turn, may provide a signal 102 to the downsampler 122. The downsampler 122 may provide the digital output signal 103. The modulator 110 and filter block 120 may further be coupled to a clock (not shown). The clock may provide an operation clock for the modulator 110 and filter block 120.

In operation, an analog signal 101 may be input to the modulator 110. The modulator 110 may sample the analog signal using a suitable modulation scheme, and provide the encoded signal 104 to the low pass filter 121. It will be appreciated that any suitable encoding scheme may be implemented, for example, an encoding scheme incorporating oversampling and/or noise shaping may be used.

In oversampling, the sampled rate of the signal 104 provided by the modulator 110 may be much higher than a required sampling rate of the signal 103. When an analog signal is sampled, noise components of the signal (for example, noise due to quantization) are spread across the frequency components of the resultant signal. While the total power of the noise components may be similar for signals sampled across a range of sampling rates, in higher sampling rates the power is spread over a larger frequency range. This means that the power of the noise components of a subset of frequencies surrounding the sample frequency of an oversampled signal may be less than the power of the noise components of the same subset of frequencies surrounding a sample frequency of a signal that is not oversampled.

In noise shaping, the noise in the sampled signal may not be spread evenly throughout the frequency range, but may be shaped or pushed to higher frequencies in the range. In this case, the power of the noise components may be similar to the power of the noise components of a sampled signal that has not been noise shaped; however, the distribution of the noise may be different. For example, by pushing the noise to higher frequencies, the low-pass filter may filter out a higher percentage of the noise than if the signal were not noise shaped.

The modulator 110 may then pass the encoded signal 104 to the filter block 120. The encoded signal 104 may be filtered by the low-pass filter 121, which may filter out some of the noise carried by the encoded signal 104. The low-pass-filtered signal 102 may then be provided to the downsampler 122, which may further process the low-pass-filtered signal 102 to down convert the low-pass-filtered signal 102 to a selected data rate. For example, the downsampler 122 may down sample the received input signal to reduce the oversampling frequency of the samples to a reduced data rate, for example to a Nyquist rate.

It will be appreciated that the encoded signal 104, the low-pass-filtered signal 102, and the output signal 103 may be digital signals including samples corresponding to the signal level of the analog signal 101.

It will be appreciated that while the ADC of FIG. 1 has been depicted having the above components, the ADC may include additional components for the processing of the analog signal. For example, further processing may be carried out on the output signal 103 before being output as a digital representation of the input signal 101. Additionally or alternatively, in some embodiments, the low-pass filter and downsampler 121 and 122 may be combined in a same circuit.

One example of an encoding scheme incorporating oversampling and noise shaping that may be implemented by the modulator 110 is Delta-Sigma ($\Delta\Sigma$) modulation. In Delta-Sigma ($\Delta\Sigma$) modulation, the analog input signal 101 may be sampled and modulated to provide pulse-density-modulated (PDM) output samples. In a pulse-density-modulated signal, a local average of the signal may correspond to a local amplitude of the sampled analog signal.

The low-pass filter 121 may low-pass filter the PDM signal 104 from the Delta-Sigma ($\Delta\Sigma$) modulator 110 to provide a local average of the PDM samples, which local average corresponds to a local amplitude of the input analog signal 101. The output of the low-pass filter 121 may, therefore, be a pulse-code-modulated signal 102. In other words, the low-pass filter 121 may remove some noise components from the PDM signal 104 and convert the PDM samples to pulse-code-modulated (PCM) samples.

The operation of the low-pass filter 121 will now be discussed with reference to its transfer function discussed below.

In some embodiments, the low-pass filter 121 may include a digital filter chain for filtering a PDM signal 104 and providing samples corresponding to an amplitude of the analog input signal. The digital filter chain may correspond to a finite-impulse-response (FIR) filter having a number of filter taps N. For example, the filter or filter chain may be an X-order filter having N=X+1 taps. In the example of FIG. 1, the number of filter taps or order of the filter may affect a delay or number of input samples required for the filter to reach a steady-state output. In the below example, the digital filter chain may be an even-tap symmetric finite-impulse-response (FIR) filter. In other embodiments, different types of filters may be used.

Figure 2:
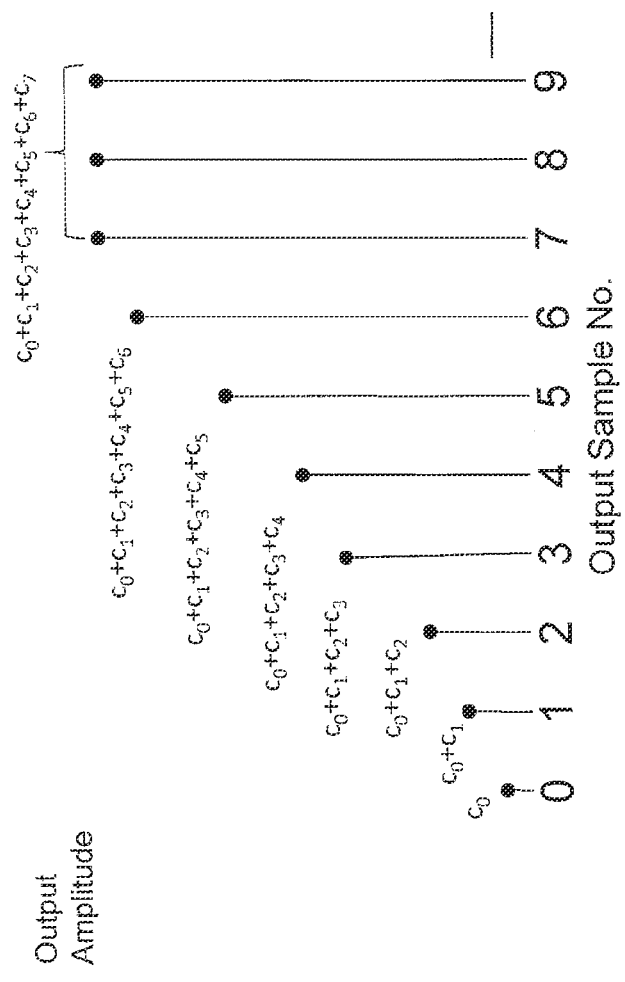
FIG. 2 shows an example of a series of output samples.

FIG. 2 shows, for example, an output digital signal of an 8-tap digital filter chain in response to a step input. It will be appreciated that the number 8 taps is by way of example only, and a more or less even number of taps may be implemented. The taps may determine the level of precision of the filter with, for example, an increase in the number of taps N corresponding to an increase in precision. The precision may correspond to a resolution of the digital output 103 provided by the ADC 100. However, it will be appreciated that an increase in the number of taps N may cause an increase in the delay introduced by the digital filter chain.

For the 8-tap symmetric FIR filter of the example, the unit step response may be given as:

$$y(n)=u(n)*h(n) \qquad (1)$$

where n is the sample number, y(n) is the step response of the filter as a function of n, u(n) is the value of the sample n input into the filter chain, and h(n) is the impulse response of the filter as a function of n.

The digital filter chain may be an 8-tap finite-impulse-response (FIR) filter with an impulse response corresponding to filter coefficients c0 to c7:

$$h(n)=[c_0 c_1 c_2 c_3 c_4 c_5 c_6 c_7] \quad (2)$$

The unit-step input of the digital filter chain may be x(n), and with equation (1), the unit-step response may be given as:

$$y(n)=x(n)*h(n) \quad (3)$$

The z-transform of x(n) is:

$$X(z)=1/(1-z^{-1}) \quad (4)$$

And the z-transform of h(n) is:

$$H(z)=[c_0+c_1 z^{-1}+c_2 z^{-2}+c_3 z^{-3}+c_4 z^{-4}+c_5 z^{-5}+c_6 z^{-6}+c_7 z^{-7}] \quad (5)$$

The z-transform of equation (3) is therefore:

$$Y(z)=X(z)H(z)=[1/(1-z^{-1})][c_0+c_1 z^{-1}+c_2 z^{-2}+c_3 z^{-3}+c_4 z^{-4}+c_5 z^{-5}+c_6 z^{-6}+c_7 z^{-7}] \quad (6)$$

Which equals:

$$Y(z)=c_0+(c_0+c_1)z^{-1}+(c_0+c_1+c_2)z^{-2}+(c_0+c_1+c_2+c_3)z^{-3}+(c_0+c_1+c_2+c_3+c_4)z^{-4}+(c_0+c_1+c_2+c_3+c_4+c_5)z^{-5}+(c_0+c_1+c_2+c_3+c_4+c_5+c_6)z^{-6}+(c_0+c_1+c_2+c_3+c_4+c_5+c_6+c_7)z^{-7} \quad (7)$$

The inverse z transform of equation (7) is:

$$y(n)=c_0\delta(0)+(c_0+c_1)\delta(1)+(c_0+c_1+c_2)\delta(2)+(c_0+c_1+c_2+c_3)\delta(3)+(c_0+c_1+c_2+c_3+c_4)\delta(4)+(c_0+c_1+c_2+c_3+c_4+c_5)\delta(5)+(c_0+c_1+c_2+c_3+c_4+c_5+c_6)\delta(6)+(c_0+c_1+c_2+c_3+c_4+c_5+c_6+c_7)\delta(7) \quad (8)$$

The output amplitude according to equation (8) of the output sample numbers is shown in FIG. 2, which shows the amplitudes of output samples 0 to 9. It will be appreciated that the output-sample numbers may correspond to the input-sample numbers. For example, output sample 0 is output in response to the input of input sample 0, and the output sample N/2 is output in response to the input sample N/2. The output sample may also correspond with the time of the output sample. For example, sample 0 may be output at $t_0$, sample 1 may be output at $t_1$, etc.

At time t=0, the first output sample having an amplitude of $c_0$ is output. At t=1, the second output sample is output with an amplitude of $c_0+c_1$, and so on, until at t=6, the sixth output sample is output with an amplitude of $(c_0+c_1+c_2+c_3+c_4+c_6+c_6)$. It will be appreciated that this is in accordance with the filter response as shown by the equations (1)-(8).

The filter chain may be in a transient state for the sample outputs 0 to 6. For example, the output of the filter may still be settling on its steady-state value. At t=7, the output of the filter reaches its steady-state value in response to the input unit-step signal with the output of the seventh sample with an amplitude of $(c_0+c_1+c_2+c_3+c_4+c_5+c_6+c_7)$. The time taken for the filter to reach its steady-state output may correspond to the number of taps of the filter. For example, it can be seen that the 8-tap filter has a delay corresponding to 8 samples (samples 0-7) from the input of a value to the output of that filtered value.

More generally, it can be said that an N-tap filter incurs a delay of N samples from the input of a first value to the steady-state-filtered output of that first value.

Operating in accordance with the above equations, the low-pass filter 121 may receive the PDM signal 104 from the modulator and low-pass filter the input samples to produce output samples signal 102. It can be seen that for each determination of the local average of the PDM signal, the low-pass filter 121 may incur a delay of N samples while the filter 121 is in a transient state before reaching steady state. In some embodiments, the low-pass-filtered output samples 102 may be input to sa decimation filter 122, which may discard the transient-state samples and use the steady-state low-pass-filtered output to provide a pulse-code-modulated (PCM) digital signal output 103 at a selected data rate. However, it will be appreciated that the filter output may be processed in a different manner.

While this N-sample delay incurred by the filter block 120 may be acceptable in some applications, it may render the filter block 120 and/or ADC 100 unsuitable for use in real-time applications and/or applications that are sensitive to delay.

Embodiments may provide a modified low-pass-filter chain and prediction unit which may address this N-sample delay.

Figure 3:
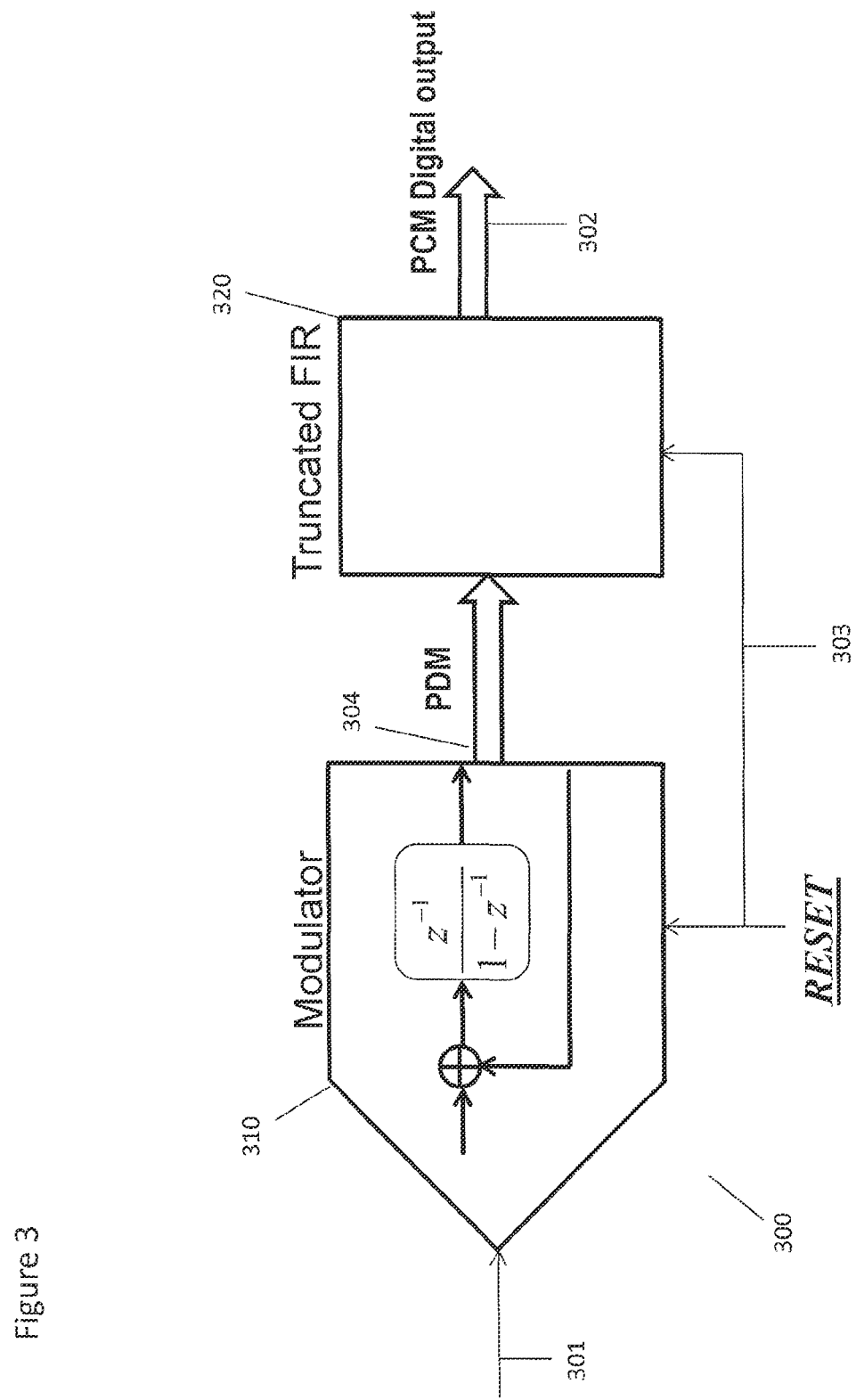
FIG. 3 is a diagram of an analog-to-digital converter according to some embodiments.

FIG. 3 is a diagram of an example of an ADC 300 according to some embodiments.

FIG. 3 shows an analog-to-digital converter (ADC) 300. The ADC 300 receives an analog input signal 301 and provides a digital output signal 302. The digital output signal 302 may include a plurality of samples corresponding to the analog input signal 301. In this example, the digital output signal 302 is a pulse-code-modulated (PCM) signal.

The ADC 300 may include a modulator 310 for encoding the analog input signal 301 in accordance with a modulation scheme and for providing an encoded signal 304. In some embodiments, the modulation scheme may be a pulse-density-modulation (PDM) scheme such as the delta-sigma ($\Delta\Sigma$) modulation scheme. In some embodiments, the (PDM) output signal may have a 1-bit resolution and be modulated in accordance with delta-sigma modulation. However, it will be appreciated that another modulation scheme and/or resolution may be used.

The modulator 310 may provide the encoded signal 104 to a truncated filter 320. The truncated filter 320 may convert and down sample the PDM encoded signal 304 to provide a pulse-code-modulated (PCM) output signal 302.

In some embodiments, the modulator 310 and the truncated filter 320 may further receive a reset signal 303. It will be appreciated that this is by way of example only, and in some embodiments, the reset signal may be applied only to the truncated FIR filter 320, or the filter may be reset by another means.

Figure 4:
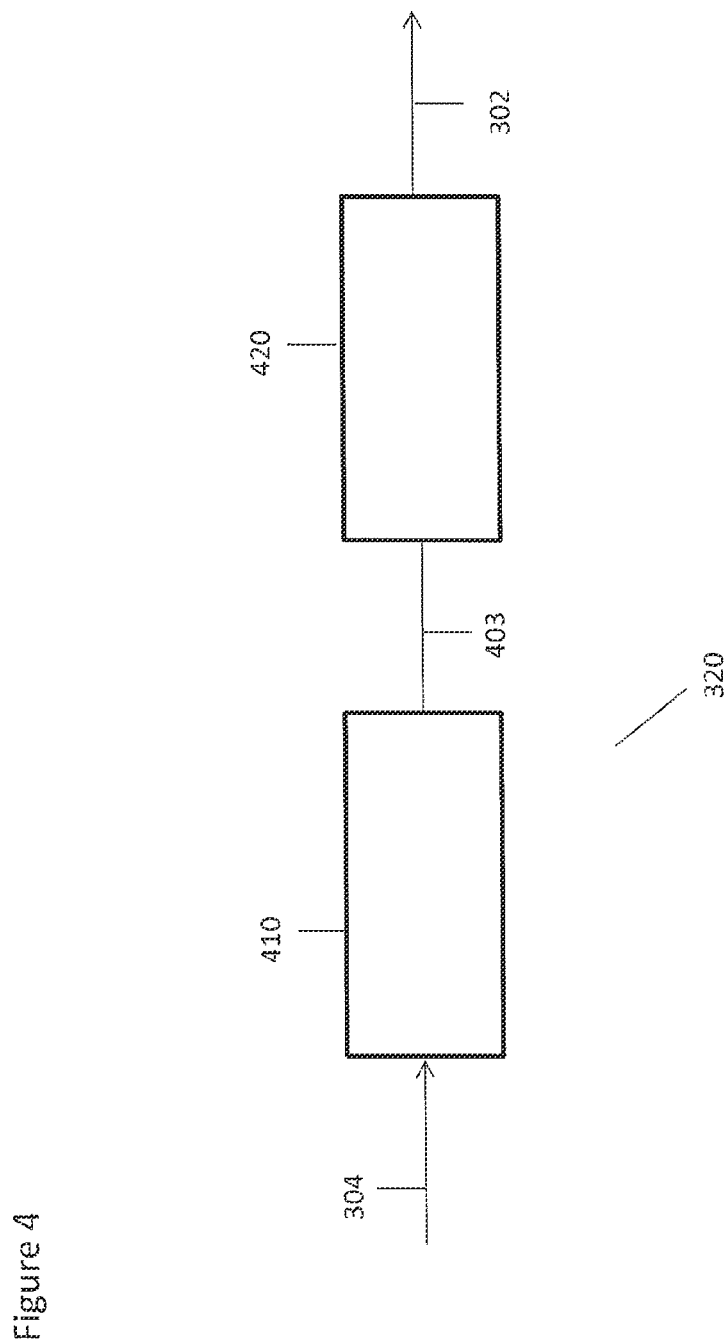
FIG. 4 is a diagram of a finite-impulse-response (FIR) filter according to some embodiments.

FIG. 4 shows an example of the truncated filter 320. The truncated filter 320 of FIG. 4 includes an N-tap low-pass filter 410, which receives the PDM signal 304 from the modulator 310, and a prediction unit 420 configured to receive the output of the low-pass filter. In some embodiments, the low-pass filter 410 may be a linear even-tap symmetric finite-impulse-response (FIR) filter. Alternative embodiments may use different types of filters.

In operation, the low-pass filter may receive a set or group of samples of the PDM signal 304 and low-pass filter these samples. In some embodiments, the set of samples may have a local average indicative of an amplitude of a corresponding part of the analog signal.

With reference to FIG. 2, it can be seen that a low-pass filter may first output samples corresponding to a transient response of the filter before the filter has reached a steady-state response. For example, for an N-tap filter in FIG. 2, N–1 output samples are output during a transient phase of the filter before a steady-state-response sample N is output.

In some embodiments, the samples corresponding to part of this transient response may provide a trajectory of the samples to the steady-state response. For example, in some embodiments, samples corresponding to a transient-phase response of the filter may be used to provide a trajectory of the output samples and used to calculate a steady-state-response output of the filter 410.

The prediction unit 420 may receive one or more samples from the low-pass filter 410 corresponding to the transient response of the filter and predict a steady-state-response output sample based on this. In this manner, the prediction unit may output a sample corresponding to a steady-state output of the low-pass filter 410 before the low-pass filter has reached steady state. For example, in embodiments, the prediction unit 420 may provide an output sample in response to an N/2 sample output by the N-tap low-pass filter 410.

In some embodiments, an output-sample value of the digital output signal 302 may be computed from at least part of a transient-state response of the low-pass filter 410. By computing the final digital output before the filter 410 has reached steady state in some embodiments, the latency introduced by the filter may be reduced.

The prediction unit 420 may exploit symmetry of the step response of a FIR filter to carry out its prediction. This symmetry may be seen with reference to FIG. 2.

In FIG. 2, it can be seen that the unit-step steady-state response of an N-tap FIR filter is $(c_0+c_1+c_2+c_3+c_4+c_5+c_6+c_7)$. For a linear-phase FIR filter, the coefficients are symmetrical. In other words, for a linear-phase FIR filter, the following is true:

$$c_0=c_7; c_1=c_6; c_2=c_5 \text{ and } c_3=c_4 \quad (9)$$

At $t_3$ (the output of sample 3 or the N/2 sample) in FIG. 2, the step response equals $c_0+c_1+c_2+c_3$.

Taking into account equation (9), for an N-tap filter, the values of the steady-state coefficients may be calculated from the coefficients provided by the N/2th output sample.

It will be appreciated that while the low-pass filter 410 and the predication unit 420 have been depicted as separate entities, they may be provided by more or fewer entities.

In operation, the low-pass filter may filter a set of samples. For example, the low-pass filter may receive and filter a first set of N/2 input samples and provide N/2 filtered samples 403. The prediction unit may receive the N/2 filtered samples and determine a steady-state output of the filter from the N/2th sample. In some embodiments, the prediction unit 420 may double the value of the N/2 sample and output this as a sample of the digital output signal 302.

Once a digital output sample is determined and output for the first set, the modulator and truncated filter may be reset to generate a second digital output signal sample from a second set of N/2 samples.

Figure 5:
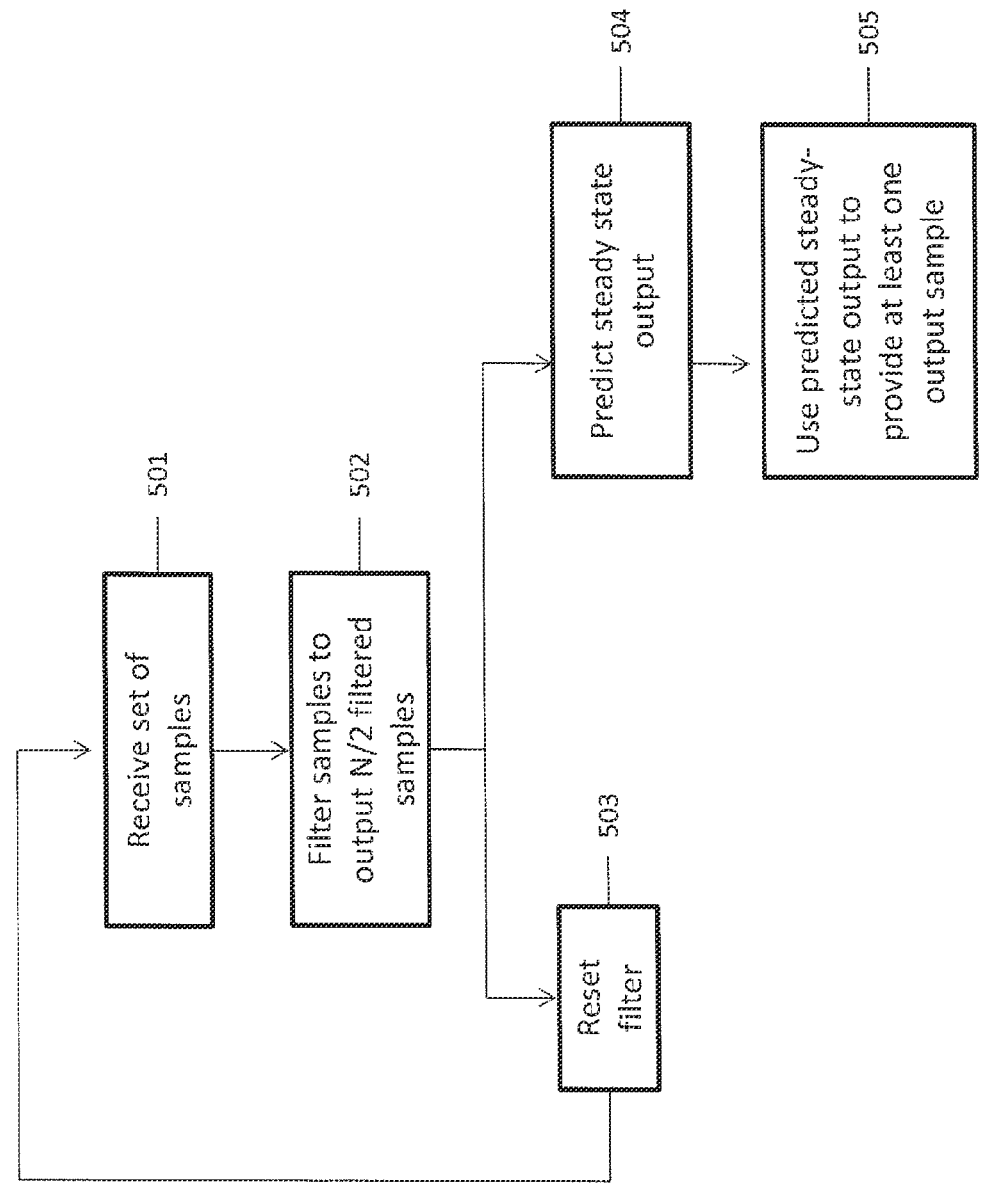
FIG. 5 is a flow diagram of the method steps carried out by an (FIR) filter of some embodiments.

FIG. 5 shows an example operation of the truncated filter 320. It will be appreciated that FIG. 5 may correspond to the operation of a truncated FIR filter such as that shown in FIGS. 4 and 5 in some embodiments.

At step 501 in FIG. 5, a low-pass filter, for example, the low-pass filter 410, starts to receive a set of samples. In some embodiments, the set of samples may correspond to the PDM signal 304 provided from the modulator 310. The set of samples may correspond to, for example N/2 samples of the PDM signal 304, where N corresponds to the number of taps of the filter. It will be appreciated that the samples may be received as they are generated by the modulator 310.

At step 502, the low-pass filter 410 may start to filter the received PDM samples and start to output filtered samples corresponding to the input samples. In some embodiments, these filtered samples 403 may correspond to the transient-state response of the filter 410. In some embodiments, the low-pass filter 410 may start filtering the samples in the set from an initial condition, for example, a reset condition.

The method then progresses to steps 503 and 504.

At step 503, the low-pass filter 410 is reset, and begins receiving and filtering a next set of sample, e.g., a next set of N/2 samples.

At step 504, the prediction unit 420 may determine a steady-state-response-output sample to form part of the output signal 302 in response to the filtered samples. For example, referring to equation (9), the prediction unit 420 may exploit the symmetry of the steady-state response of the N-tap filter 410 to calculate steady-state coefficients from the coefficients provided by the N/2th sample. In some embodiments, the prediction unit 420 may double a value of the N/2th sample in order to predict the value of the steady-state output sample of the filter 410. The sample may be output as part of the digital output signal 302 at step 505.

It will be appreciated that one or more of the samples output by the low-pass filter 410 may be provided to the prediction unit 420. In some embodiments, the entire sample trajectory, for example the first to N/2th sample, from the low-pass filter 410 may be provided to the prediction unit 420. In this case, the prediction unit 420 may use these samples to determine when the N/2th filtered sample of the set of samples has been received. In other embodiments, only the N/2th sample from the low-pass filter 410 may be provided to the prediction unit 420.

Once an output sample for the input set of samples has been determined by the prediction unit 420, the truncated filter may be reset after step 505 instead of, or in addition to, being reset at step 503. It will be appreciated that this reset may reset the low-pass filter 410 to an initial condition. In the embodiments of FIG. 5, the modulator 410 may also be reset. It will be appreciated the modulator 310 and truncated filter 320 may receive a reset signal or be reset by another means.

In some embodiments, the operation of the modulator 310 and the truncated filter 320 may be governed by the sample clock; however, in some embodiments, the modulator 310 and truncated filter 320 may be reset in response to a high-speed clock.

Once the modulator 310 and truncated filter 320 have been reset, the method may return to step 501 (FIG. 5), where samples of a second set of samples may start to be received and filtered.

While steps 501 and 502 have been depicted as sequential, it will be appreciated that these steps may be somewhat simultaneous or overlapping as samples may be received while a previous sample of the set of samples is being filtered.

It will also be appreciated that the predicted steady-state output may be used to provide at least one PCM output sample.

It will be appreciated that the truncated filter 320 may both convert the PDM input samples from the modulator 310 to PCM output samples as well as down sample the received PDM signal 304. In embodiments where the set of samples includes N/2 samples, the steady-state response of the low-pass filter 410 may correspond to the local average of the N/2 samples in the set. The prediction unit 420 may calculate this local average by doubling the N/2th sample from the low-pass filter 410 as well as output one sample on the digital output signal 302 for every N/2 samples of the PDM signal 304. In other embodiments, the prediction unit 420 may output more than one steady-state-response sample for a set of samples.

In some embodiments, the prediction unit 420 or truncated filter 320 may further include a down sampler if necessary for reducing the data rate of the output of the prediction unit 420. In the foregoing, reference has been made to a selected data rate. It will be appreciated that the data rate may be set by various means. For example, the data rate may be set or adjusted by a down sampler. In some embodiments, the down sampler may adjust the data rate to a predetermined value. In other embodiments, the data rate may be determined during operation of the ADC. For example, a data-rate input may be received, and the data rate may be adjusted accordingly. In other embodiments, the data rate may be the Nyquist rate.

It will be appreciated that an analog-to-digital converter according to embodiments may be implemented in a variety of applications. For example, an analog-to-digital converter in accordance with some embodiments may be implemented in audio-signal processing systems, for example, in a microphone.

It will further be appreciated that while a ΔΣ modulation scheme has been described, embodiments may be applied to other modulation or encoding schemes applicable to an analog-to-digital converter. For example, another pulse-density-modulation scheme may be implemented.

It will further be appreciated while that an 8-tap filter has been given as an example, embodiments may apply to any linear even-tap filter.

Some aspects of the embodiments may be implemented in hardware, while other aspects may be implemented in firmware or software, which may be executed by a controller, microprocessor, or other computing device, although the disclosure is not limited thereto. While various embodiments of the disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special-purpose circuits or logic, general-purpose hardware or controller or other computing devices, or some combination thereof.

The apparatus may, for example, form part of a personal computer, part of circuitry to process a microphone input, as part of a mobile device, tablet, or any receiver having analog-to-digital requirements. Some embodiments may be implemented by computer software executable by a data processor of the mobile device, such as in the processor entity, or by hardware, or by a combination of software and hardware.

Further in this regard it should be noted that any blocks of the logic flow as in the FIGS. may represent program steps, or intercoupled logic circuits, blocks, and functions, or a combination of program steps and logic circuits, blocks, and functions. The software may be stored on such physical media as memory chips, or memory blocks implemented within the processor, magnetic media such as hard disk or floppy disks, and optical media such as, for example, DVD and the data variants thereof, or a CD.

Moreover, the truncated filter 320 may be part of an ADC (per above) or another type of first integrated circuit, which may be coupled to a second integrated circuit that is disposed on a same or different integrated-circuit die than the first integrated circuit. And one or both of the first and second integrated circuits may be a controller such as a microprocessor or microcontroller.

From the foregoing it will be appreciated that, although specific embodiments have been described herein for purposes of illustration, various modifications may be made without deviating from the spirit and scope of the disclosure.

Furthermore, where an alternative is disclosed for a particular embodiment, this alternative may also apply to other embodiments even if not specifically stated.

The invention claimed is:

1. An apparatus, comprising:
    a digital signal processor configured to generate a value of a transient portion of a digital processed signal; and
    a predictor configured to generate a value of a steady-state portion of the signal in response to the value of the transient portion.

2. The apparatus of claim 1 wherein the signal processor is configured to generate the value of the transient portion of the processed signal in response to an input signal.

3. The apparatus of claim 1 wherein the signal processor includes a filter.

4. The apparatus of claim 1 wherein:
    the signal processor is configured to generate a number of samples of the transient portion of the processed signal; and
    the value of the transient portion of the processed signal is equal to a value of one of the samples.

5. The apparatus of claim 1 wherein:
    the signal processor includes a number of taps and is configured to generate, in response to a sample of an input signal, a number of samples of the processed signal that is less than the number of taps; and
    the value of the transient portion of the processed signal is equal to a value of one of the samples of the processed signal.

6. The apparatus of claim 1 wherein:
    the signal processor includes a number of taps and is configured to generate, in response to a sample of an input signal, a number of samples of the processed signal that is equal to half the number of taps; and
    the value of the transient portion of the processed signal is equal to a value of a most-recent sample of the processed signal.

7. The apparatus of claim 1 wherein: the predictor is configured to generate the value of the steady-state portion of the signal equal to a product of the value of the transient portion of the processed signal and a factor.

8. The apparatus of claim 1 wherein:
    the signal processor includes a number of taps and is configured to generate, in response to a sample of an input signal, a number of samples of the processed signal that is equal to half the number of taps;
    the value of the transient portion of the processed signal is equal to a value of a most-recent sample of the processed signal; and
    the predictor is configured to generate the value of the steady-state portion of the signal equal to a product of the value of the transient portion of the processed signal and a factor of two.

9. An apparatus, comprising:
    a finite-impulse-response filter configured to generate a value of a transient portion of a digital processed signal; and
    a predictor configured to generate a value of a steady-state portion of the signal in response to the value of the transient portion.

10. An apparatus, comprising:
    a low-pass filter configured to generate a value of a transient portion of a digital processed signal; and
    a predictor configured to generate a value of a steady-state portion of the signal in response to the value of the transient portion.

11. An analog-to-digital converter, comprising:
    a sampler having a modulator configured to convert an analog signal into a digital signal;

a digital signal processor configured to generate a value of a transient portion of a processed signal in response to the digital signal; and a predictor configured to generate a value of a steady-state portion of the processed signal in response to the value of the transient portion of the processed signal.

12. The analog-to-digital converter of claim 11 wherein the sampler includes a sigma-delta modulator.

13. The analog-to-digital converter of claim 11 wherein:

the sampler is configured to convert the analog signal into a pulse-density-modulated digital signal; and the signal processor is configured to generate a value of a transient portion of a pulse-code-modulated processed signal.

14. The analog-to-digital converter of claim 11, further comprising a downsampler configured to reduce a sampling rate of the steady-state portion of the processed signal.

15. A system, comprising:

a first integrated circuit including a sampler configured to convert an analog signal into a digital signal a signal processor configured to generate a value of a transient portion of a processed signal in response to the digital signal, and a predictor configured to generate a value of a steady-state portion of the processed signal in response to the value of the transient portion of the processed signal; and a second integrated circuit coupled to the first integrated circuit.

16. The system of claim 15 wherein the first and second integrated circuits are disposed on a same die.

17. The system of claim 15 wherein the first and second integrated circuits are disposed on respective dies.

18. The system of claim 15 wherein one of the first and second circuits includes a controller.

19. A method, comprising:

sampling a signal having a transient portion;

generating a value of the transient portion of the signal through a filter; and predicting a value of a steady-state portion of the signal in response to the value of the transient portion.

20. The method of claim 19 wherein generating the value of the transient portion of the signal includes:

generating a number of samples of the transient portion of the signal; and generating the value of the transient portion of the signal equal to a value of one of the samples.

21. The method of claim 19 wherein generating the value of the transient portion of the signal includes:

generating with a signal processor having a number of taps a number of samples of the signal that is less than the number of taps; and generating the value of the transient portion of the signal equal to a value of one of the samples.

22. The method of claim 19 wherein generating the value of the transient portion of the signal includes:

resetting a signal processor having a number of taps;

generating with the signal processor a number of samples of the signal that is less than the number of taps; and generating the value of the transient portion of the signal equal to a value of one of the samples.

23. The method of claim 19 wherein generating the value of the transient portion of the signal includes:

generating with a signal processor having a number of taps a number of samples of the signal that is equal to half the number of taps; and generating the value of the transient portion of the signal equal to a value of a most-recent sample of the signal.

24. The method of claim 19 wherein predicting a value of a steady-state portion of the signal includes generating the value of the steady-state portion of the signal equal to a product of the value of the transient portion of the signal and a factor.

25. The method of claim 19 wherein:

generating the value of the transient portion of the signal includes generating with a signal processor having a number of taps a number of samples of the signal that is equal to half the number of taps, and generating the value of the transient portion of the signal equal to a value of a most-recent sample of the signal; and predicting a value of a steady-state portion of the signal includes generating the value of the steady-state portion of the signal equal to a product of the value of the transient portion of the signal and a factor of two.

26. A non-transitory computer-readable medium including instructions that, when executed, cause an apparatus:

to sample a signal having a transient portion;

to generate a value of the transient portion of the signal;

to filter the transient portion of the signal; and to predict a value of a steady-state portion of the signal in response to the value of the filtered transient portion.

* * * * *